(12) United States Patent
Bhattad et al.

(10) Patent No.: US 11,601,093 B2
(45) Date of Patent: Mar. 7, 2023

(54) DIFFERENTIAL AMPLIFIER

(71) Applicant: Silego Technology Inc., Santa Clara, CA (US)

(72) Inventors: Ambreesh Bhattad, Swindon (GB); Gary Hague, Swindon (GB)

(73) Assignee: Silego Technology Inc., Santa Clara, CA (US)

(*) Notice: Subject to any disclaimer, the term of this patent is extended or adjusted under 35 U.S.C. 154(b) by 0 days.

(21) Appl. No.: 17/484,069

(22) Filed: Sep. 24, 2021

(65) Prior Publication Data

US 2022/0103128 A1    Mar. 31, 2022

Related U.S. Application Data

(60) Provisional application No. 63/083,124, filed on Sep. 25, 2020.

(51) Int. Cl.
*H03F 1/02* (2006.01)
*H03F 3/45* (2006.01)
*G05F 1/575* (2006.01)

(52) U.S. Cl.
CPC ....... *H03F 1/0211* (2013.01); *H03F 3/45273* (2013.01); *G05F 1/575* (2013.01)

(58) Field of Classification Search
CPC .............. H03F 1/0211; H03F 3/45273; H03F 3/45632; H03F 2203/45476; H03F 3/45183; H03F 2203/45508; H03F 1/26; H03F 1/301; H03F 3/45179; H03F 2200/372; H03F 2203/45026; H03F 2203/45031; H03F 2203/45038; G05F 1/575
USPC .......................... 330/252–261, 296–297, 285
See application file for complete search history.

(56) References Cited

U.S. PATENT DOCUMENTS 10,571,945 B2 * 2/2020 Pishdad .................. G05F 1/575

* cited by examiner

*Primary Examiner* — Hieu P Nguyen
(74) *Attorney, Agent, or Firm* — Saile Ackerman LLC; Stephen B. Ackerman

(57) ABSTRACT

The present document relates to differential amplifiers. A differential amplifier may comprise a current source, a first transistor, a second transistor, and a compensation circuit. A reference voltage may be applied to a first terminal of the first transistor, and a second terminal of the first transistor may be coupled to an output of the current source. A feedback voltage may be applied to a first terminal of the second transistor, and a second terminal of the second transistor may be coupled to the output of the current source. The compensation circuit may comprise a capacitive element coupled to the first terminal of the first transistor, and the compensation circuit may be configured to reduce a change of the reference voltage at the first terminal of the first transistor.

18 Claims, 4 Drawing Sheets

DIFFERENTIAL AMPLIFIER

This application claims the benefit of U.S. Provisional patent application Ser. No. 63/083,124, filed on Sep. 25, 2020, which is herein incorporated by reference in its entirety, and assigned to a common assignee.

TECHNICAL FIELD

The present document relates to differential amplifiers. In particular, the present document relates to dynamically biased differential amplifiers which may be used in low noise low-dropout (LDO) regulators. Therein, the reference voltage may be filtered using on-chip techniques.

BACKGROUND

There is an increasing demand for low noise low-dropout (LDO) regulators e.g. in the field of high performance cameras for smartphones. FIG. 1 shows a simplified schematic of a dynamically biased differential amplifier 1 for a low noise LDO. It comprises a current source 11 for injecting a dynamically adaptable current I+Idyn into the transistors 12 and 13. For example, the injected current may vary from 0.25 uA (I) to 160 uA (I+Idyn). A filtered reference voltage Vref is applied to the gate of transistor 12, and a feedback voltage is applied to the gate of transistor 13. Typically, a filter capacitor 14 is dimensioned large enough to stabilize the reference voltage Vref.

However, in a low noise application scenario, the gate-source capacitance of reference transistor 12 may be relatively high (due to low noise requirement and inability to apply chopping techniques on the input stage), which may lead to a substantial amount of coupling between the source and the gate of reference transistor 12. If, for example, the output load of the LDO increases, the current injected into transistors 12 and 13 may increase e.g. from 0.25 uA to 160 uA. As a result, the voltage at the common source 15 of transistors 12 and 13 may be reduced by 130 mV, which in turn couples to the reference voltage via the gate-source capacitance $C_{GS}$ of transistor 12. Ultimately, this coupling may cause a reduction of the reference voltage by 1 mV.

In general, the change of the reference voltage ΔVref may be expressed by the following formula $$\Delta Vref = \frac{Cgs}{Cfilt}(Vgs(I + Idyn) - Vgs(I))$$

wherein Cfilt denotes the capacitance of the filter capacitor 14, $V_{gs}$(I+Idyn) denotes the gate-source voltage of transistor 12 caused by the injected current I+Idyn, and $V_{gs}$(I) denotes the gate-source voltage of transistor 12 caused by the injected current I. As a result, a larger filter capacitor 14 may be required to compensate for the variations of the reference voltage ΔVref.

SUMMARY

The present document addresses the above-mentioned technical problems. In particular, the present document addresses the technical problem of providing a dynamically biased differential amplifier which is robust against noise caused by the dynamic biasing and/or which requires a smaller filter capacitor.

A differential amplifier may comprise a current source, a first transistor, a second transistor, and a compensation circuit. A reference voltage may be applied to a first terminal of the first transistor, and a second terminal of the first transistor may be coupled to an output of the current source. A feedback voltage may be applied to a first terminal of the second transistor, and a second terminal of the second transistor may be coupled to the output of the current source. The compensation circuit may comprise a capacitive element coupled to the first terminal of the first transistor, and the compensation circuit may be configured to reduce a change of the reference voltage at the first terminal of the first transistor.

The transistors may be metal-oxide-semiconductor field effect transistors MOSFETs, insulated-gate bipolar transistors IGBTs, MOS-gated thyristors, or other suitable transistors. For instance, the first terminal of the first transistor may be a gate terminal, the first terminal of the second transistor may be a gate terminal, the second terminal of the first transistor may be a source terminal, and the second terminal of the second transistor may be a source terminal. In addition, a third terminal of the first transistor may be a drain terminal, and a third terminal of the second transistor may be a drain terminal.

The differential amplifier may be configured to generate voltages/currents at the third terminals of both the first and the second transistor based on a difference between the feedback voltage and the reference voltage. Depending on the application scenario, the feedback voltage may be e.g. derived from a node within an LDO regulator.

As will be discussed in more detail in the following description, variations of an output current provided by the current source may cause undesired variations of the reference voltage at the first terminal of the first transistor. The proposed compensation circuit makes it possible to reduce or even minimize said variations, and to quickly stabilize the reference voltage at a constant value. Thus, noise in the reference voltage may be substantially reduced. Or, if the same noise level is maintained, the capacitance of a capacitor which is typically used to stabilize the reference voltage (and which may be coupled to the first terminal of the first transistor) may be reduced.

The capacitive element may be e.g. a capacitor or another device capable of storing electrical energy in an electric field. The current source may be coupled between said output of the current source and a reference potential. Throughout this document, the term "reference potential" is meant in its broadest possible sense. In particular, the reference potential is not limited to ground i.e. a reference potential with a direct physical connection to earth. Rather, the term "reference potential" may refer to any reference point to which and from which electrical currents may flow or from which voltages may be measured. Moreover, it should be mentioned that the reference potentials mentioned in this document may not necessarily refer to the same physical contact. Instead, the reference potentials mentioned in this document may relate to different physical contacts although reference is made to "the" reference potential for ease of presentation.

The current source may be configured to dynamically adjust the output current at the output of the current source, and the compensation circuit may be configured to reduce the change of the reference voltage at the first terminal of the first transistor based on the output current.

Specifically, the current source may be configured to dynamically adjust the output current injected into (the second terminals of) the first transistor and the second transistor. As a consequence, a voltage at the output of the current source may vary in response to a variation of said output current. In yet other words, it may be said that the differential amplifier is configured to be dynamically biased by the output current of the current source. For example, the current source may be configured to dynamically adjust the output current based on a load current at an output of an external LDO power converter. In particular, the current source may be configured to dynamically increase the output current if the load current at the output of the external LDO power converter increases. By adapting the output current, the bandwidth of differential amplifier may be increased, the power supply rejection ratio (PSRR) may be increased, and noise may be reduced.

Therefore, the compensation circuit may be seen as a feedback circuit which is capacitively coupled to the reference voltage and configured to regulate the reference voltage based on the output current.

The differential amplifier may further comprise a filter capacitor coupled to the first terminal of the first transistor. For example, the filter capacitor may be coupled between the first terminal of the first transistor and a reference potential. Moreover, the first terminal of the first transistor may be a high impedance terminal.

As already mentioned above, the first terminal of the first transistor may be a gate of the first transistor, and the second terminal of the first transistor may be a source of the first transistor. A capacitance of the capacitive element may be equal to a gate-source capacitance of the first transistor.

The capacitive element may be coupled between a compensation node and the first terminal of the first transistor. The compensation circuit may be configured to generate a compensation voltage at the compensation node, wherein a change of the compensation voltage is inversely proportional to a change of the voltage at the output of the current source caused by the change of the output current.

In particular, the compensation circuit may further comprise a unity gain inverting amplifier configured to generate the compensation voltage at the compensation node by inverting a voltage at the output of the current source.

Alternatively or additionally, the compensation circuit may further comprise a compensation transistor and an additional current source. The compensation transistor may be coupled between the additional current source and the compensation node. Specifically, a gate of the compensation transistor may be coupled to the compensation node, a source of the compensation transistor may be coupled to a reference potential, a drain of the compensation transistor may be coupled to the additional current source, and the drain of the compensation transistor may be coupled to the gate of the compensation transistor.

The additional current source may be arranged between a supply voltage and the drain terminal of the compensation transistor. The additional current source may be configured to provide an output current corresponding to half the output current of the current source. The compensation transistor may have a similar or equal (maximum) current density as the first transistor. For example, the compensation transistor and the first transistor may be identical.

Alternatively, or additionally, the current source may comprise a primary current source and a current mirror comprising a first mirror transistor and a second mirror transistor. The primary current source may be configured to inject a current into the first mirror transistor. The first mirror transistor may be configured to translate the injected current into an intermediate voltage. The second mirror transistor may be configured to translate the intermediate voltage into a current which is injected in both the first and the second transistor. The capacitive element may be coupled between the first terminal of the first transistor and said intermediate voltage.

According to another aspect, a method of operating a differential amplifier is described. The method may comprise steps which correspond to the features of the differential amplifier described in the present document. In particular, the differential amplifier may comprise a current source, a first transistor, a second transistor, and a compensation circuit with a capacitive element. The method may comprise applying a reference voltage to a first terminal of the first transistor. The method may comprise coupling a second terminal of the first transistor to an output of the current source. The method may comprise applying a feedback voltage to a first terminal of the second transistor. The method may comprise coupling a second terminal of the second transistor to the output of the current source. The method may comprise coupling the capacitive element to the first terminal of the first transistor. The method may comprise reducing, by the compensation circuit, a change of the reference voltage at the first terminal of the first transistor.

Moreover, the method may comprise dynamically adjusting, by the current source, an output current at the output of the current source. The method may comprise reducing, by the compensation circuit, the change of the reference voltage at the first terminal of the first transistor based on the output current.

The differential amplifier may comprise a filter capacitor coupled to the first terminal of the first transistor. The first terminal of the first transistor may be a gate of the first transistor, the second terminal of the first transistor may be a source of the first transistor, and a capacitance of the capacitive element may be equal to a gate-source capacitance of the first transistor.

The method may comprise coupling the capacitive element between a compensation node and the first terminal of the first transistor. The method may comprise generating, by the compensation circuit, a compensation voltage at the compensation node such that a change of the compensation voltage is inversely proportional to a change of the voltage at the output of the current source caused by the change of the output current.

The compensation circuit may further comprise a unity gain inverting amplifier. The method may comprise generating, by the unit gain inverting amplifier, the compensation voltage at the compensation node by inverting a voltage at the output of the current source.

The compensation circuit may further comprise a compensation transistor and an additional current source. The method may comprise coupling the compensation transistor between the additional current source and the compensation node. To be more specific, the method may comprise coupling a gate of the compensation transistor to the compensation node. The method may comprise coupling a source of the compensation transistor to a reference potential. The method may comprise coupling a drain of the compensation transistor to the additional current source. The method may comprise coupling the drain of the compensation transistor to the gate of the compensation transistor.

Further, the current source may comprise a primary current source and a current mirror comprising a first mirror transistor and a second mirror transistor. The method may comprise injecting, by the primary current source, a current into the first mirror transistor. The method may comprise translating, by the first mirror transistor, the injected current into an intermediate voltage. The method may comprise translating, by the second mirror transistor, the intermediate voltage into a current which is injected in both the first and the second transistor. The method may comprise coupling the capacitive element between the first terminal of the first transistor and said intermediate voltage.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein like or identical reference numerals denote like or identical elements, and wherein.

DESCRIPTION

Figure 1:
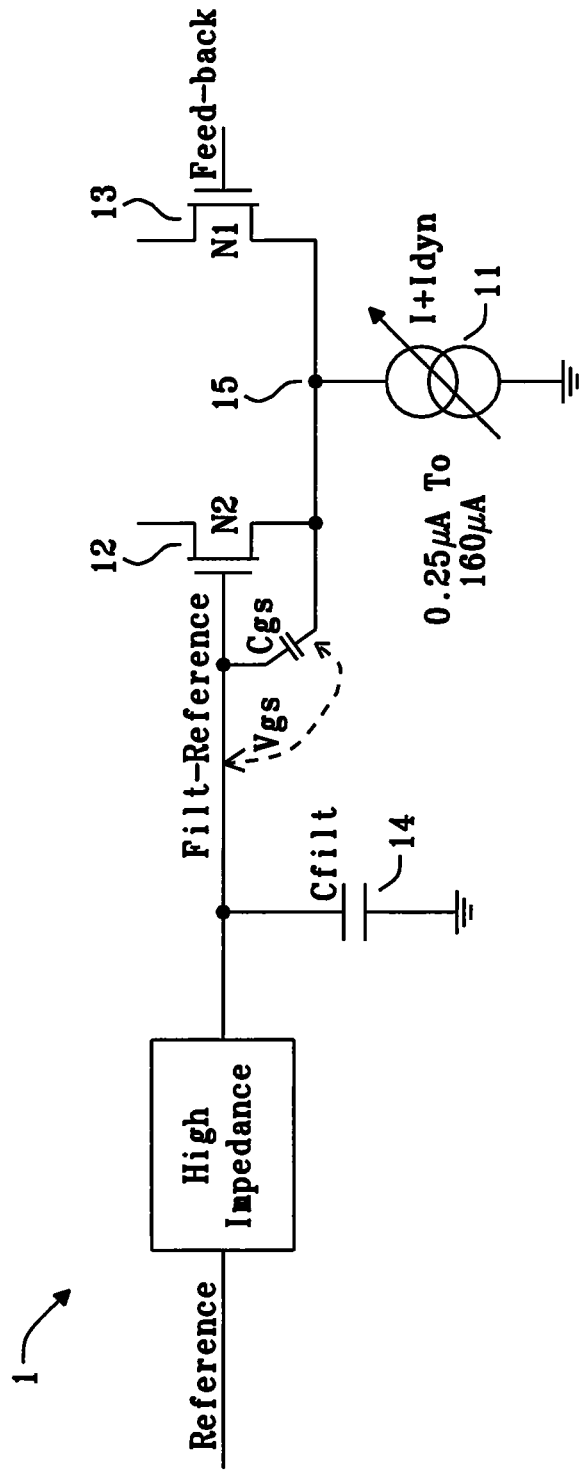
FIG. 1 shows a simplified schematic of a dynamically biased differential amplifier.
Figure 2:
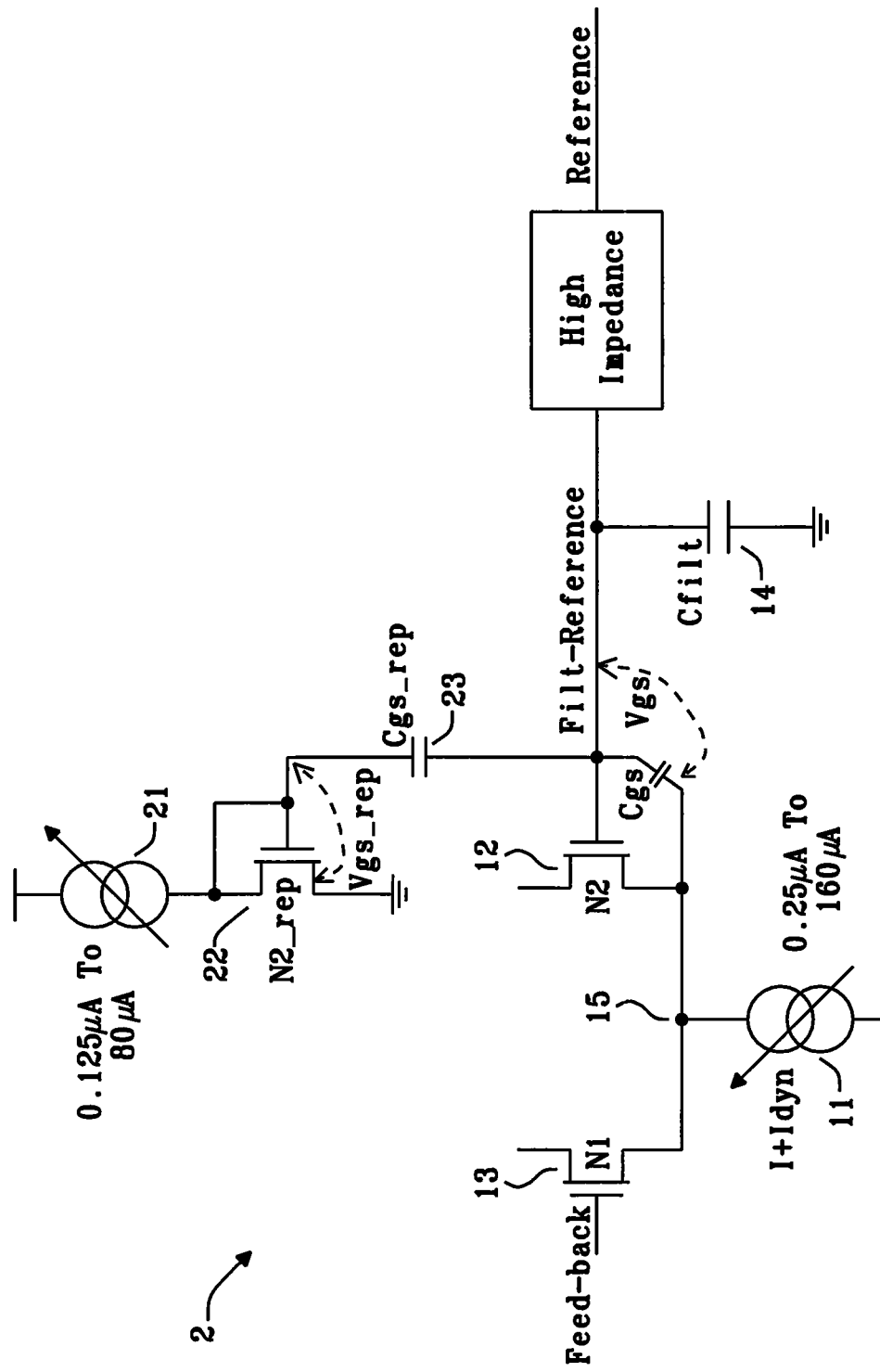
FIG. 2 shows a first embodiment of a dynamically biased differential amplifier with a compensation circuit.

FIG. 2 shows a first embodiment of a dynamically biased differential amplifier 2 with a compensation circuit. This exemplary circuit comprises a current source 11 for injecting a dynamically adaptable current I+Idyn into the transistors 12 and 13. For example, the injected current may vary from 0.25 uA (I) to 160 uA (I+Idyn). A filtered reference voltage Vref is applied to the gate of transistor 12, and a feedback voltage is applied to the gate of transistor 13. As illustrated in FIG. 2, the gate of transistor 12 has a high impedance and is coupled via filter capacitor 14 to ground. For low noise applications, the transistors 12 and 13 need to be in strong inversion and need a large area. This increases their gate-source capacitance and therefore the coupling between the common source node and the reference voltage.

As illustrated in FIG. 2, the compensation circuit comprises a compensation transistor 22, an additional current source 21, and a capacitive element 23. The compensation transistor 22 is coupled between the additional current source 21 and a compensation node. Specifically, a gate of the compensation transistor 22 is coupled to the compensation node, a source of the compensation transistor 22 is coupled to a reference potential, a drain of the compensation transistor 22 is coupled to the additional current source 21, and the drain of the compensation transistor 22 is coupled to the gate of the compensation transistor 22. The additional current source 21 is arranged between a supply voltage and the drain terminal of the compensation transistor 22. As can be seen in FIG. 2, the additional current source 21 may be configured to provide an output current corresponding to half the output current of the current source 11. The compensation transistor 22 may have a similar or equal (maximum) current density as the transistor 12. Or, the compensation transistor 22 may have a similar or equal gate-source capacitance as the transistor 12. For example, the compensation transistor 22 and the first transistor 12 may be identical.

That is, compensation transistor 22 is biased dynamically similar to transistor 12. As a result, the gate-source voltage $V_{gs\_rep}$ changes in a similar manner as the gate-source voltage $V_{gs}$. In both cases, the gate-source voltage increases, but in compensation transistor 22 the gate voltage increases similar to the reduction of the source voltage of transistor 12. The capacitive element 23 may have a capacitance value similar to the capacitance value of the inherent gate-source capacitance of transistor 12. Thus, the positive excursion of the gate of the compensation transistor 22 cancels the negative excursion seen on the source of transistor 12, which minimizes the change in the value of the reference voltage caused by the biasing.

Figure 3:
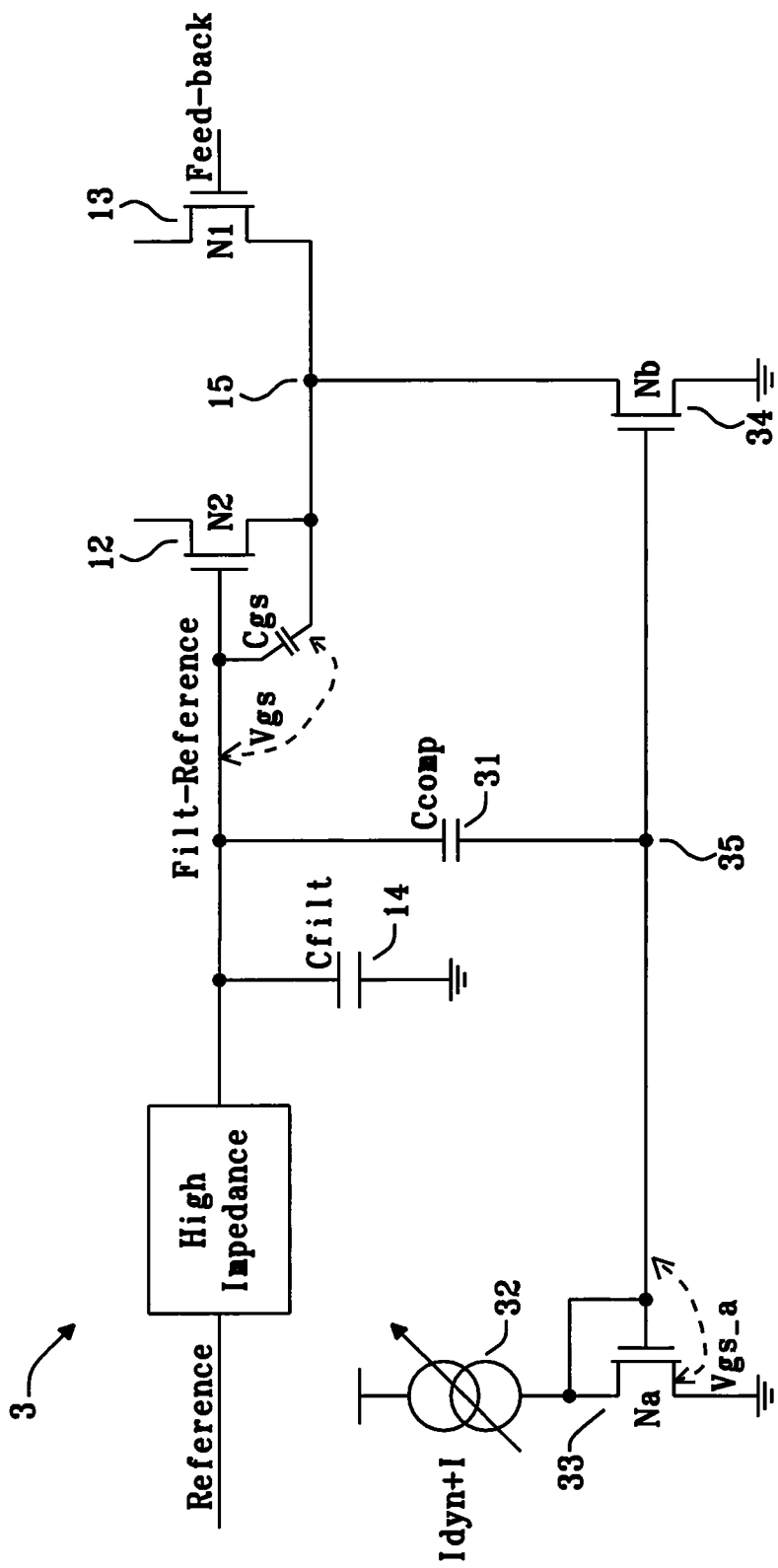
FIG. 3 shows a second embodiment of a dynamically biased differential amplifier with a compensation circuit.

FIG. 3 shows a second embodiment of a dynamically biased differential amplifier 3 with a compensation circuit. In this second embodiment, an intermediate voltage generated within the current source itself is re-used/tapped as a compensation voltage. Therefore, no additional current source is required. In FIG. 3, the current source comprises a primary current source 32 and a current mirror comprising a first mirror transistor 33 and a second mirror transistor 34. The primary current source 32 injects a current into the first mirror transistor 33. The first mirror transistor 33 translates the injected current into an intermediate voltage at a compensation node 35. As already mentioned, this intermediate voltage is used as compensation voltage in this embodiment. The second mirror transistor 34 translates the intermediate/compensation voltage into a current which is injected in both the first and the second transistor 12 and 13. The capacitive element 31 is coupled between the gate terminal of the transistor 12 and said compensation node 35. In this embodiment, the capacitance of capacitive element 31 may also be chosen different from the gate-source capacitance of transistor 12 to get the correct gain for compensation.

Figure 4:
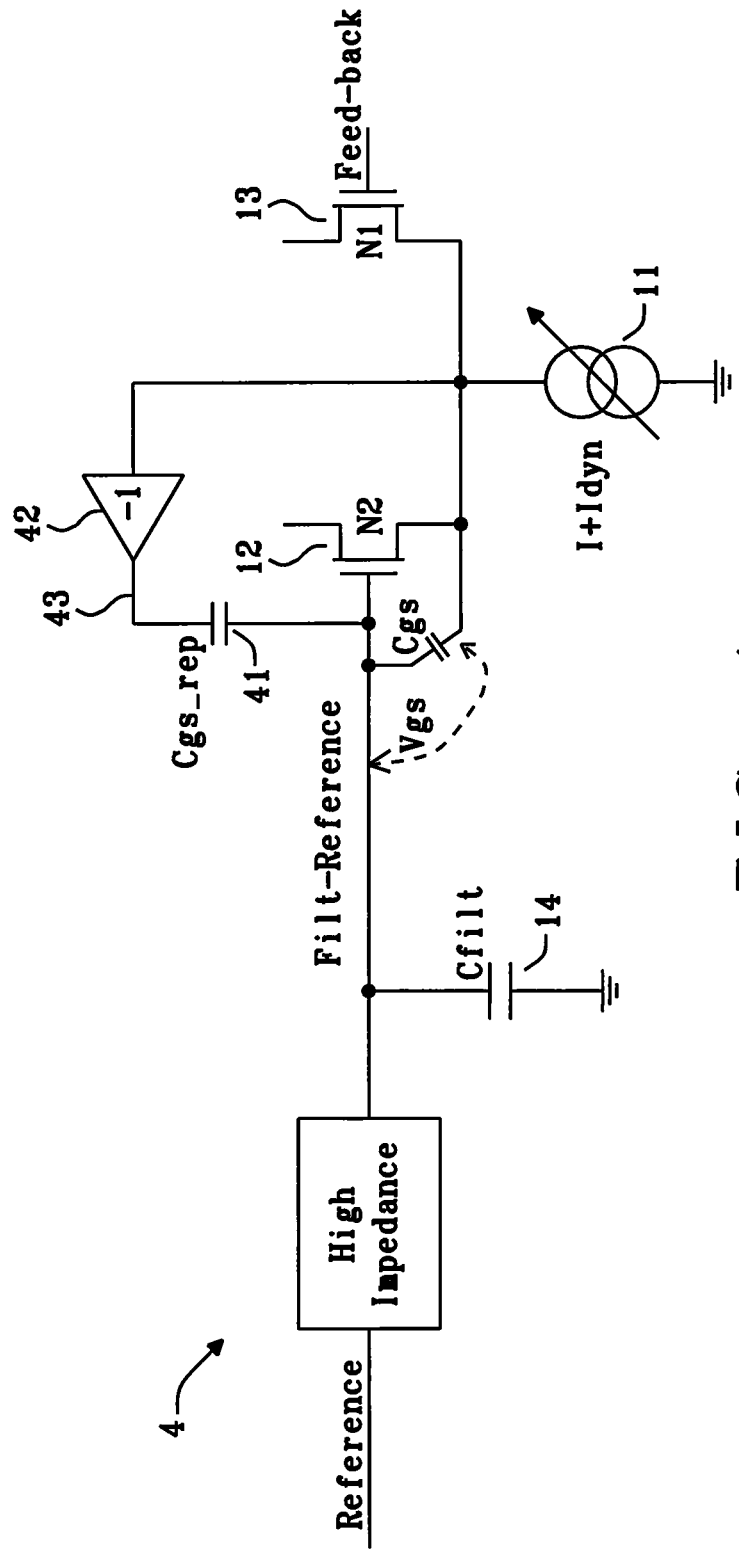
FIG. 4 shows a third embodiment of a dynamically biased differential amplifier with a compensation circuit.

Finally, FIG. 4 shows a third embodiment of a dynamically biased differential amplifier 4 with a compensation circuit. In this case, the compensation circuit comprises a unity gain inverting amplifier 42 which generates the compensation voltage at the compensation node 43 by inverting a voltage at the output of the current source. Again, this compensation voltage is coupled to the gate of transistor 12 via a suitable capacitive element 41.

In conclusion, the present document proposes a novel amplifier for a low-noise LDO regulator where noise in the LDO reference voltage is reduced by an integrated (on-chip) filter, creating a high impedance at one of the inputs of the LDO regulator. In the LDO regulator, the bias current for the input transistor pair may have a large modulation (e.g. as a function of load current) for improved circuit performance. For example, a low noise LDO regulator may use an internal ultra-low noise reference and may incorporate dynamic biasing of internal circuits (as a function of output load current) to achieve the required performance.

The dynamic bias modifies the operating point, and this impacts the filtered low noise reference. The change in operating point can increase or decrease the absolute value of reference. In the present document, the same dynamic bias is used to generate the inverse effect and is capacitively coupled back into the reference to cancel or minimize the change in absolute value. As an advantage, the filtered capacitor can be further reduced even with increase in the size of differential pair (transistors 12 and 13) for improved noise performance.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A differential amplifier comprising
   a current source,
   a first transistor, wherein a reference voltage is applied to a first terminal of the first transistor, and wherein a second terminal of the first transistor is coupled to an output of the current source,
   a second transistor, wherein a feedback voltage is applied to a first terminal of the second transistor, and wherein a second terminal of the second transistor is coupled to the output of the current source, and
   a compensation circuit with a capacitive element coupled to the first terminal of the first transistor, wherein the compensation circuit is configured to reduce a change of the reference voltage at the first terminal of the first transistor.

2. The differential amplifier according to claim 1, wherein the current source is configured to dynamically adjust an output current at the output of the current source, and wherein the compensation circuit is configured to reduce the change of the reference voltage at the first terminal of the first transistor based on the output current.

3. The differential amplifier according to claim 1, further comprising a filter capacitor coupled to the first terminal of the first transistor.

4. The differential amplifier according to claim 1, wherein the first terminal of the first transistor is a gate of the first transistor, the second terminal of the first transistor is a source of the first transistor, and a capacitance of the capacitive element is equal to a gate-source capacitance of the first transistor.

5. The differential amplifier according to claim 2, wherein
   the capacitive element is coupled between a compensation node and the first terminal of the first transistor, and
   the compensation circuit is configured to generate a compensation voltage at the compensation node, wherein a change of the compensation voltage is inversely proportional to a change of the voltage at the output of the current source caused by the change of the output current.

6. The differential amplifier according to claim 5, wherein the compensation circuit further comprises a unity gain inverting amplifier configured to generate the compensation voltage at the compensation node by inverting a voltage at the output of the current source.

7. The differential amplifier according to claim 5, wherein the compensation circuit further comprises a compensation transistor and an additional current source, and wherein the compensation transistor is coupled between the additional current source and the compensation node.

8. The differential amplifier according to claim 7, wherein
   a gate of the compensation transistor is coupled to the compensation node,
   a source of the compensation transistor is coupled to a reference potential,
   a drain of the compensation transistor is coupled to the additional current source, and
   the drain of the compensation transistor is coupled to the gate of the compensation transistor.

9. The differential amplifier according to claim 1, wherein the current source comprises a primary current source and a current mirror comprising a first mirror transistor and a second mirror transistor, and wherein
   the primary current source is configured to inject a current into the first mirror transistor,
   the first mirror transistor is configured to translate the injected current into an intermediate voltage,
   the second mirror transistor is configured to translate the intermediate voltage into a current which is injected in both the first and the second transistor, and
   the capacitive element is coupled between the first terminal of the first transistor and said intermediate voltage.

10. A method of operating a differential amplifier comprising a current source, a first transistor, a second transistor, and a compensation circuit with a capacitive element, the method comprising
    applying a reference voltage to a first terminal of the first transistor,
    coupling a second terminal of the first transistor to an output of the current source,
    applying a feedback voltage to a first terminal of the second transistor,
    coupling a second terminal of the second transistor to the output of the current source,
    coupling the capacitive element to the first terminal of the first transistor, and
    reducing, by the compensation circuit, a change of the reference voltage at the first terminal of the first transistor.

11. The method according to claim 10, comprising
    dynamically adjusting, by the current source, an output current at the output of the current source, and
    reducing, by the compensation circuit, the change of the reference voltage at the first terminal of the first transistor based on the output current.

12. The method according to claim 10, wherein the differential amplifier comprises a filter capacitor coupled to the first terminal of the first transistor.

13. The method according to claim 10, wherein the first terminal of the first transistor is a gate of the first transistor, the second terminal of the first transistor is a source of the first transistor, and a capacitance of the capacitive element is equal to a gate-source capacitance of the first transistor.

14. The method according to claim 11, comprising
    coupling the capacitive element between a compensation node and the first terminal of the first transistor, and
    generating, by the compensation circuit, a compensation voltage at the compensation node such that a change of the compensation voltage is inversely proportional to a change of the voltage at the output of the current source caused by the change of the output current.

15. The method according to claim 14, wherein the compensation circuit further comprises a unity gain inverting amplifier, and the method comprises
    generating, by the unit gain inverting amplifier, the compensation voltage at the compensation node by inverting a voltage at the output of the current source.

16. The method according to claim 14, wherein the compensation circuit further comprises a compensation transistor and an additional current source, and the method comprises coupling the compensation transistor between the additional current source and the compensation node.

17. The method according to claim 16, comprising coupling a gate of the compensation transistor to the compensation node, coupling a source of the compensation transistor to a reference potential, coupling a drain of the compensation transistor to the additional current source, and coupling the drain of the compensation transistor to the gate of the compensation transistor.

18. The method according to claim 10, wherein the current source comprises a primary current source and a current mirror comprising a first mirror transistor and a second mirror transistor, and wherein the method comprises injecting, by the primary current source, a current into the first mirror transistor, translating, by the first mirror transistor, the injected current into an intermediate voltage, translating, by the second mirror transistor, the intermediate voltage into a current which is injected in both the first and the second transistor, and coupling the capacitive element between the first terminal of the first transistor and said intermediate voltage.

\* \* \* \* \*